United States Patent [19]

Eichelberger et al.

[11] Patent Number: 4,571,322

[45] Date of Patent: Feb. 18, 1986

[54] METHOD FOR PROVIDING INSULATED HOLES IN CONDUCTING SUBSTRATE

[75] Inventors: Charles W. Eichelberger, Schenectady; Robert J. Wojnarowski, Ballston Lake; Abraham Auerbach, Albany, all of N.Y.

[73] Assignee: General Electric Company, Schenectady, N.Y.

[21] Appl. No.: 751,926

[22] Filed: Jul. 5, 1985

Related U.S. Application Data

[62] Division of Ser. No. 445,125, Nov. 29, 1982.

[51] Int. Cl.⁴ .............................................. B29C 39/12
[52] U.S. Cl. .................................... 264/154; 264/267; 264/273
[58] Field of Search .................. 264/154, 267, 273

[56] References Cited

U.S. PATENT DOCUMENTS

| | | | |
|---|---|---|---|
| 3,893,233 | 7/1975 | Glover | 264/154 X |
| 3,972,974 | 8/1976 | Pico | 264/273 X |
| 4,202,091 | 5/1980 | Ohnishi | 264/273 X |

Primary Examiner—Philip Anderson
Attorney, Agent, or Firm—Geoffrey H. Krauss; James C. Davis, Jr.; Marvin Snyder

[57] ABSTRACT

A method for providing insulated holes in a conductive substrate by first punching oversized holes in the substrate, then filling the holes with an insulator and then forming an aperture of a desired diameter, less than the diameter of the hole originally punched in the substrate, through the insulator to leave an annular sleeve of insulative material within each hole.

8 Claims, 5 Drawing Figures

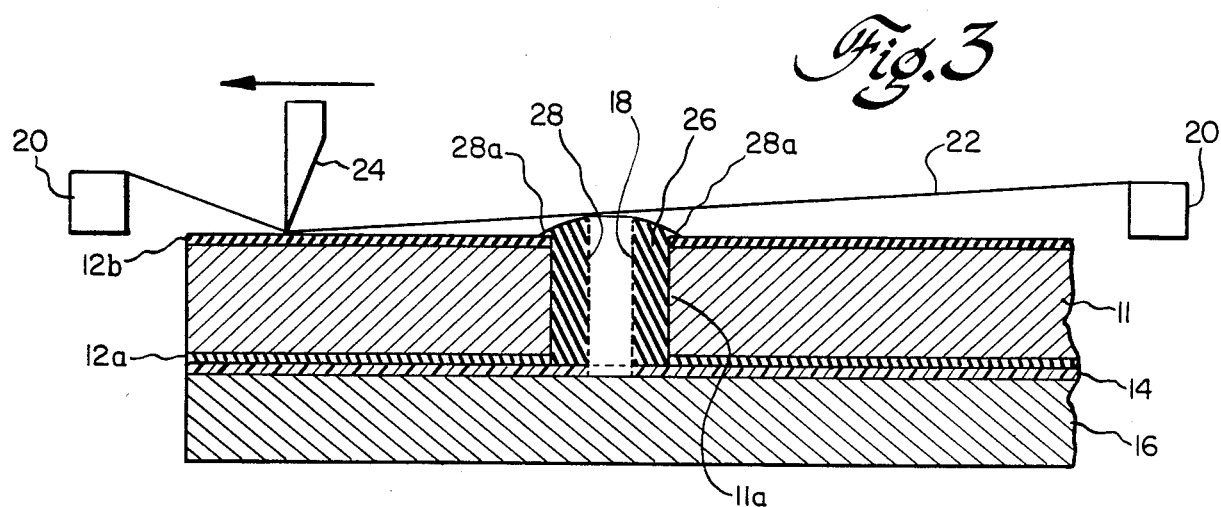
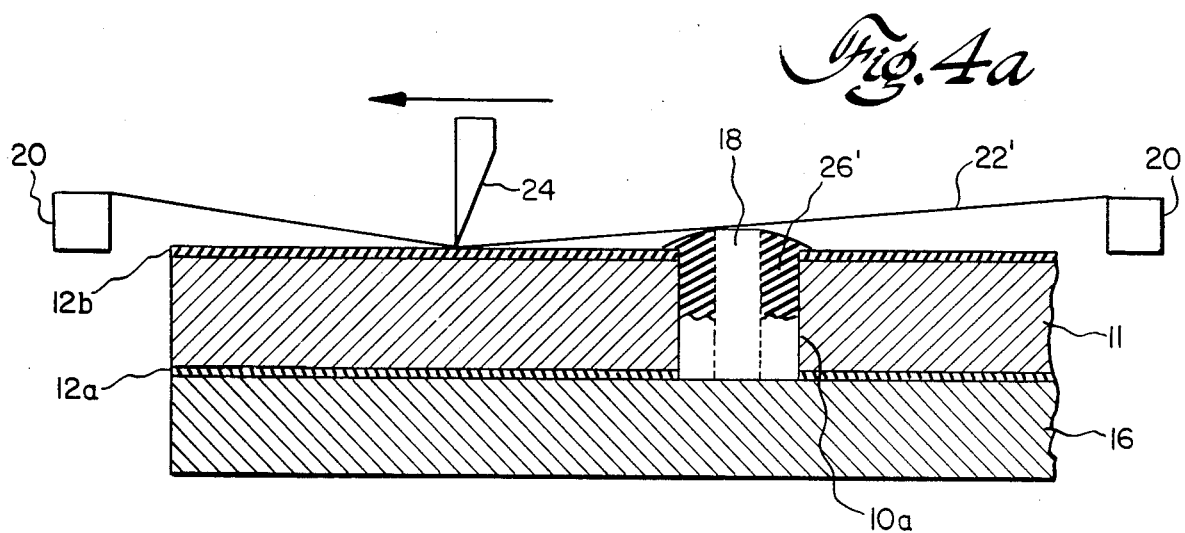
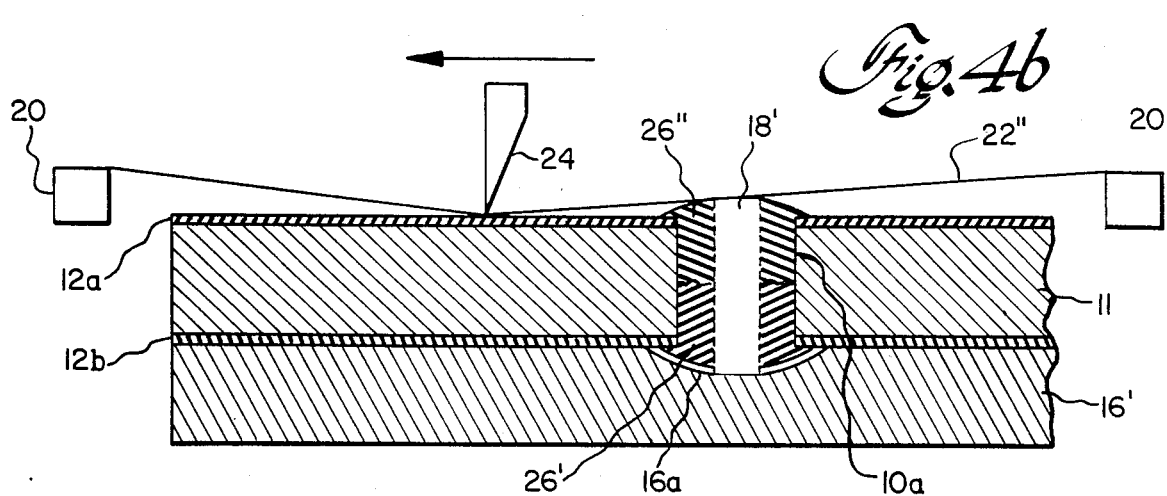

METHOD FOR PROVIDING INSULATED HOLES IN CONDUCTING SUBSTRATE

This application is a division, of application Ser. No. 445,125, filed Nov. 29, 1982.

BACKGROUND OF THE INVENTION

The present invention relates to printed circuit board technology and, more particularly, to a novel method for providing insulative holes in a conductive substrate.

It is well known to use a printed circuit board for supporting electronic parts and the conductive leads interconnecting these parts. It is highly desirable to form such printed circuit boards on a substrate which has high heat-conduction capacity and high strength. Substrate materials such as steel and aluminum are preferable, as these materials are low cost and are also capable of being formed into various shapes. In particular, the use of steel as a substrate material is additionally desirable in that a steel substrate can be handled by magnetic handling means during processing. However, steel, aluminum and the like are conductive materials and must be insulated if used as a substrate. Many materials are available for insulating a conductive substrate.

It is often desirable, in the assembly of electronic systems, to provide holes in the printed circuit board, especially where large electronic components are to be mounted on a first side of the board, with leads passing through the board to an opposite side, upon which opposite side smaller components, of the chip variety and the like, may be mounted. By mounting components on both sides of a printed circuit board, wave soldering may be utilized to connect the components on both board sides in a single operation. In this manner, components which cannot withstand the temperature environment of direct soldering may be mounted. Many electronic circuit configurations, such as a touch panel in which the printed touch switchs are to be on one side of a substrate and the sensing controller electronics are to be mounted on the other side of the same substrate, will thus require holes allowing interconnection of components from one side of a substrate to the other. Therefore, a conducting substrate of material such as steel, aluminum, copper and the like, approaches the ideal substrate material for a double-sided printed circuit board, which board must, of necessity, have insulated holes passing through the substrate.

BRIEF SUMMARY OF THE INVENTION

In accordance with the invention, a method for providing insulated holes, of a first size, in a conductive substrate, includes the steps of: providing a substrate of a desired conductive material; forming apertures, of a size greater than the first size, through the substrate in at least one desired location; filling the apertures with a mass of an insulating material; and forming each of the first-sized holes through the associated insulating material mass to leave an insulating material sleeve between the hole and the conductive substrate.

In presently preferred embodiments, an insulative layer is fabricated upon the solid portions of each surface of the substrate prior to filling of the substrate apertures with the insulative material, whereby the insulative sleeve forms a continuous insulator with the surface layers. The holes can be formed, after curing of the insulative material mass, by drilling; use of a pin-bearing plate, supporting the layer-substrate-layer sandwich during introduction of the insulating material mass into each aperture, forms the associated hole when the mass is cured and the plate and its pins are removed.

Accordingly, it is an object of the present invention to provide a conductive substrate having insulated holes formed therethrough.

This and other objects of the present invention will become apparent upon consideration of the following detailed description, when read in conjunction with the drawings.

BRIEF DESCRIPTION OF THE DRAWINGS

FIG. 3 is a sectional side view of the substrate and fixture of FIG. 2, illustrating the formation of insulated holes in each substrate aperture; and FIGS. 4a and 4b are a pair of sectional side views of a fixture and substrate for forming insulated portions in each hole in accordance with an alternate embodiment of the method of the present invention.

DETAILED DESCRIPTION OF THE INVENTION

Figure 1:
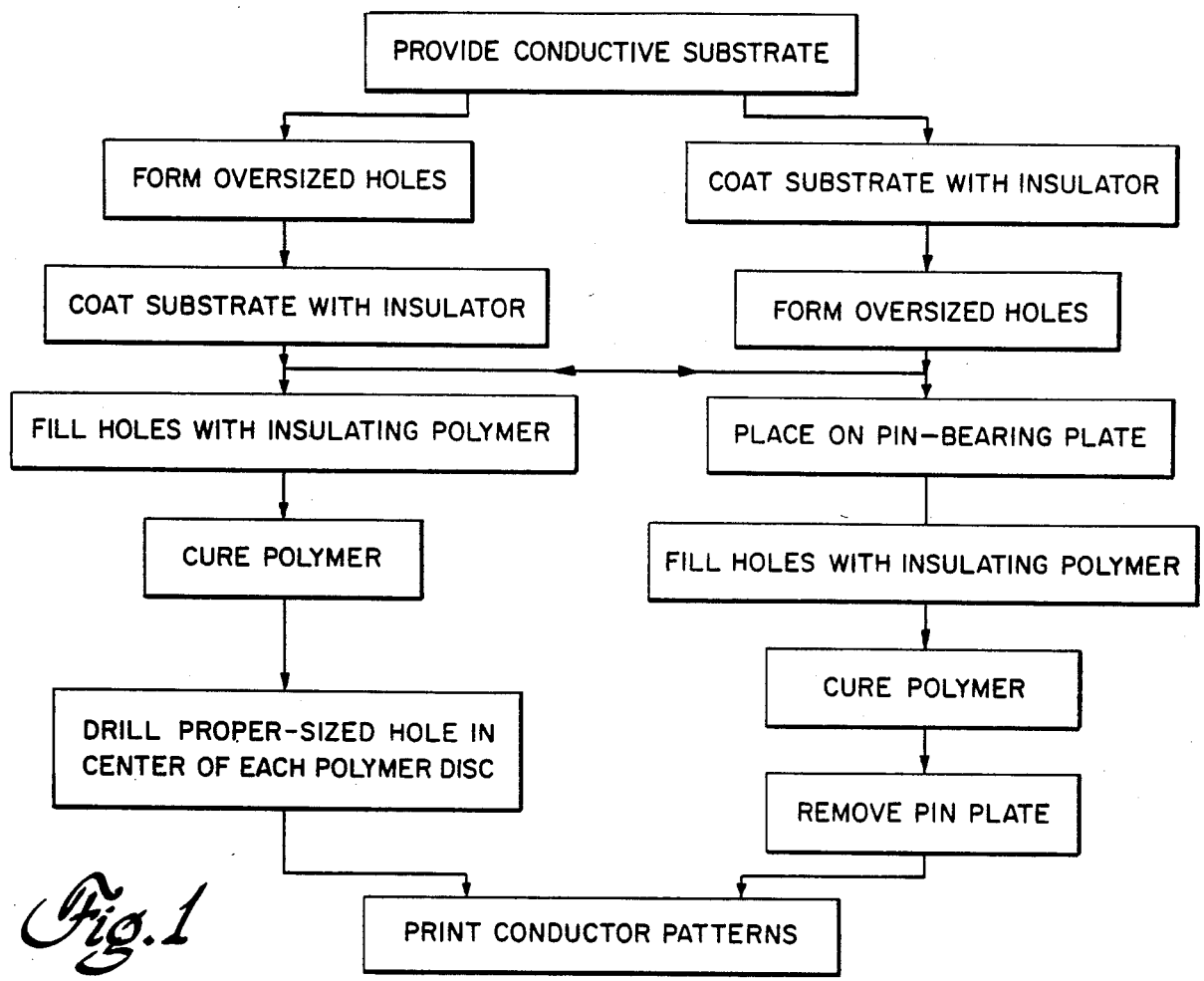
FIG. 1 is a block diagram illustrating the steps of the method of the present invention for providing insulated holes through a conductive substrate.
Figure 2:
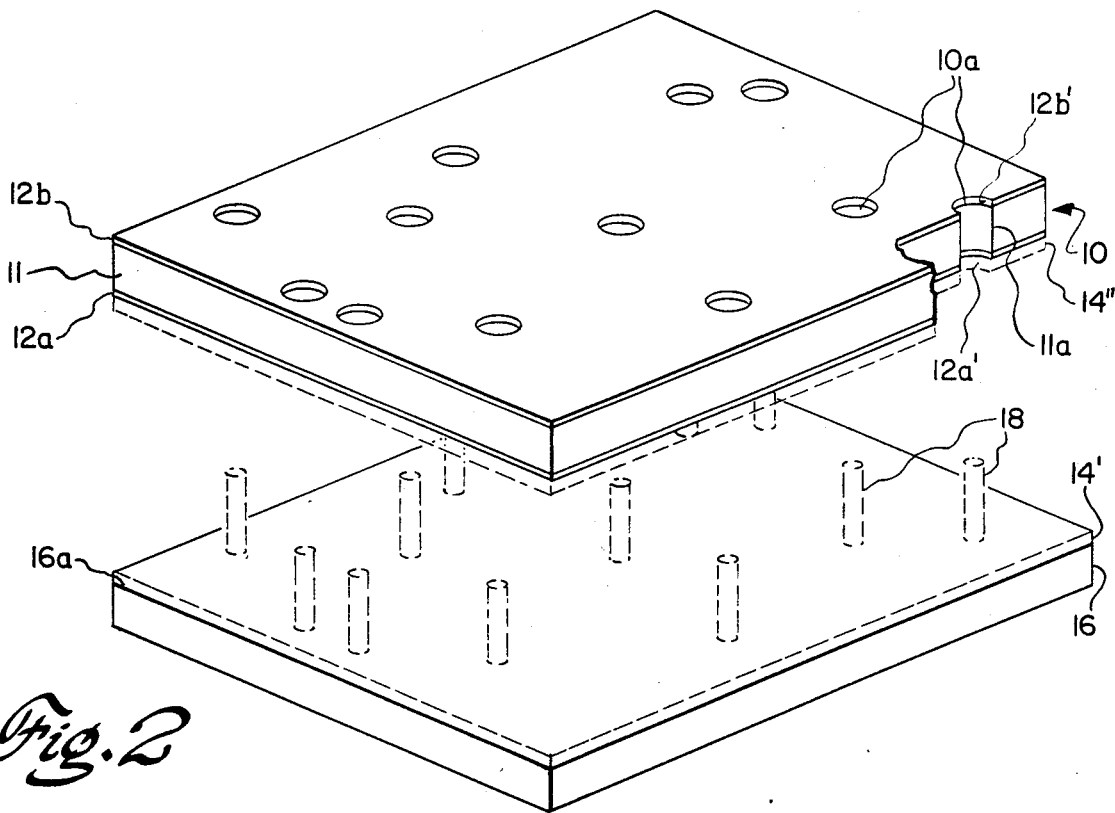
FIG. 2 is a perspective view of a substrate having a plurality of apertures therethrough, in which insulation is to be provided, and of a fixture utilized therewith in accordance with the principles of the present invention.

Referring initially to FIGS. 1, 2 and 3, a printed circuit board 10 is fabricated from a conductive substrate 11 having one of insulative layers 12a and 12b upon each of the opposite surfaces thereof. An insulated hole 10a is to be fabrigated through the printed circuit board 10 at each desired location, with a portion of each hole insulated from the adjacent conductive walls of an aperture 11a formed through the substrate. The conductive substrate 11 of the circuit board may be, in one presently preferred embodiment, initially formed with each of the apertures 11a therethrough to define the multiplicity of printed circuit board holes 10a required. Thereafter, the surfaces of substrate 11 are coated with insulative layers 12a and 12b, with the coating method and apparatus being chosen such that the insulative layer materials only adhere to the substrate surface and thus leave apertures 12a' and 12b' in the insulative layers over each of substrate apertures 11a. Alternatively, the solid substrate 11 may be first coated upon the opposite surfaces thereof with the insulative materials forming layers 12a and 12b and then drilled, punched or subjected to the like operations to form each of the apertures 10a completely through the sandwich of insulator 12a, conductive substrate 11 and insulative layer 12b. Either method provides aperture 12a' and 12b' in each of the opposed insulative layers, substantially of the same size as and in registration with the aperture 11a through the conductive substrate. Each of the apertures 10a thus formed is an oversized aperture having dimensions greater than the dimensions of the desired insulated hole to be formed through board 10.

The apertured insulator-substrate-insulator board 10 is then, in accordance with one presently preferred embodiment of the method, positioned in abutment with a sheet 14 of a release material, i.e. a material to which the insulative material mass will not adhere, e.g. polyvinyl fluoride and the like. The release sheet can be a sheet 14' provided upon a surface 16a of a holding member 16, or can be a sheet 14" provided upon the surface of that insulative layer, e.g. insulative layer 12a, which will be brought into abutment with the surface 16a of the holding member 16, now devoid of sheet 14'. After positioning sandwich board 10 upon the holding member 16, each of apertures 10a is filled with an insulating material, preferably a polymer, such as an epoxy resist and the like. As shown in FIG. 3, the step of filling apertures 10a with the insulating polymer can be carried out by screen printing, utilizing a printing frame 20 holding a screen 22, having suitable art work thereon to allow the polymer to be pushed through the screen apertures by a member 24, as the member moves over the surface of the screen. Thereafter, the polymer is cured and a hole 28, of size less than the size of initial aperture 10a, is formed through each of the cured insulative polymer deposits. Thus, each insulative material mass deposited in one of apertures 10a has a clear hole formed therethrough, to leave a sleeve 26 of insulative material extending through the hole, and providing, with insulative layers 12a and 12b, complete insulation of the conductive substrate 11 from an object disposed within hole 28 or areas adjacent thereto on either side of board 10.

In accordance with another presently preferred method of the invention, holding plate member 16 is provided with a pin 18 extending from the board-supporting plate surface 16a substantially at the location of the center of each of the initial apertures 10a in which an insulative sleeve is to be fabricated. Board 10 is positioned upon plate 16 such that each of pins 18 is substantially centered within the associated one of apertures 10a, when board 10 is clamped to plate 16 (by means not shown for reasons of simplicity). The length of each pin 18 is greater than the total thickness of the sandwiched board, between opposite surfaces of insulative layers 12a and 12b. Advantageously, each pin 18 is coated with a release material similar to that used for release sheet 14. After securing board 10 to plate 16, the insulating material, e.g. the selected insulating polymer, is introduced into each of apertures 10a, between the exterior periphery of the associated pin 18 and the walls of the apertures 12a', 11a and 12b', respectively, formed through the respective lower insulating layer, conductive substrate and upper insulating layer. Any desired method of introducing the insulative polymer into the annular volume may be utilized, such as the screen printing method illustrated in FIG. 3. The insulating polymer filling the annular volume is then cured and the pin-bearing plate is removed, to leave a printed circuit board having the apertures 10a therethrough filled with an annular sleeve 26 of insulative material, and in which drilling of the final hole 28 is not required.

The printed circuit board is completed by printing conductor patterns, as required, upon either or both surfaces of insulative sheets 12a and 12b, utilizing the insulated holes as required and with the conductor patterns being deposited in manner known to the art.

The foregoing embodiment allows the apertures 10a to be filled with insulative material, in a single pass of member 24 when screen-printing is used, for relatively large apertures, e.g. an aperture of 80 mil diameter in a 20 mil thick steel substrate. We have also found some advantage in forming a screen opening slightly larger than the diameter of the aperture 10a to be filled, to leave a "rivet head" 28a formation on the sleeve 28 about the aperture.

For apertures of lesser dimension, with respect to the thickness of the sandwiched board 10, several passes of member 24 may be required to force the insulative material mass completely down the length of the aperture. The method of FIGS. 4a and 4b may be used to advantage in this situation. The board is placed on a first holding member 16 (FIG. 4a) and the insulating material mass 26' forced through a first screen 22' and down a portion of the length of the aperture 10a. The viscosity of the insulative material 26' is adjusted such that the material is forced down about one-half the length of aperture 10a, from a first substrate surface, e.g. that surface on which layer 12b is formed. Because the insulative material does not extend entirely through the aperture, there is no material present adjacent to, or at, plate 16 and a release sheet is not needed. If pin 18 is used, the material 28' may require some curing to prevent collapse of the final hole, which might otherwise occur when pin 18 is withdrawn.

Thereafter, the board is flipped over such that the first surface (having e.g. layer 12b thereon) is downward and tne the board is positioned upon another holding member 16'. If pins are used, the second plate 16' has pins 18' arranged in a mirror image of the arrangement of pins 18 in the first plate 16. If material mass 26' was formed with a "rivet head", plate 16' may require a depressed formation 16a around each aperture 10a location for accommodation thereof, whether or not pins 18' are used. Once the board is properly positioned on plate 16', an additional amount 26" of the insulative material is introduced from the remaining board surface (e.g. through the layer 12a apertures) to fill the remaining portion of the apertures 10a. If screen printing is used, the second screen 22" will be the mirror image of the first screen 22' used during introduction of the first material portion 26'.

It should ge understood that the insulative material may be curable by an appropriate means, such as by receipt of thermal energy, ultraviolet energy and the like, and that each final hole and the associated oversized initial aperture may be of any desired shape, with a substantially constant sleeve thickness (between the clear hole and the substrate aperture wall) being desirable, but not mandatory. Round apertures and holes can be formed by drilling in low-cost manner, while slots or more complex shapes may require use of punching or other higher-cost tooling arrangements.

While several presently preferred methods and apparatus for providing insulated holes in a conductive substrate have been described herein, many variations and modifications will now become apparent to those skilled in the art. It is my intent, therefore, to be limited only by the scope of the appending claims and not by the specific instrumentalities and details presented by way of description herein.

What is claimed is:

1. A method for providing at least one insulated hole, of a first size, in a substrate of a conductive material, comprising the steps of:
    (a) providing the substrate of a desired conductive material;
    (b) forming an aperture, of a size greater than the first size, through the substrate in each location at which one of the at least one holes is to be located;
    (c) filling each aperture with a mass of an insulating material; and
    (d) forming the first-sized hole through each associated insulating material mass to leave an insulating material sleeve between the hole and the conductive substrate.

2. The method of claim 1, wherein step (c) includes the steps of: completely filling each aperture with the insulating material mass; and then at least partially curing the insulating material; and step (d) includes the step of forming the first-sized hole through the cured mass of insulating material.

3. The method of claim 1, wherein step (d) includes the step of providing a pin temporarily extending through the bore of at least one of the apertures, prior to commencement of the aperture filling step (c); step (c) includes the steps of: filling the aperture, between the exterior surface of the pin extending therethrough and the interior surface of the aperture through the conducting substrate, with the insulating material mass; and then at least partially curing the insulating material mass; and step (d) also includes the step of: then withdrawing the pin from the at least partially cured insulating material mass to leave the first-sized hole therethrough.

4. The method of claim 1, further comprising the step of fabricating an insulating layer upon at least one of the opposed pair of surfaces of the conductive substrate, each insulative layer having apertures therethrough in alignment with each of the apertures in the conductive substrate.

5. The method of claim 4, wherein said at least one insulative layer is fabricated upon the associated substrate surface prior to forming the apertures through the conductive substrate and the at least one insulating layer.

6. The method of claim 4, wherein the apertures through the conductive substrate are formed prior to fabricating at least one insulative layer upon the remaining solid portions of the conductive substrate.

7. The method of claim 4, further comprising the step of printing a conductive pattern upon a free surface of at least one insulative layer.

8. The method of claim 1, wherein step (c) includes the steps of filling a portion of each aperture inwardly from a first surface of the substrate with the insulating material; and then introducing additional insulating material from the remaining surface of the substrate to fill the remainder of the aperture.

* * * * *